US012776131B2

(12) United States Patent
Wei et al.

(10) Patent No.: US 12,776,131 B2
(45) Date of Patent: Oct. 27, 2026

(54) SYSTEM AND METHODS FOR MACHINE-ASSISTED MAP EDITING TOOLS

(71) Applicant: MappedIn Inc., Waterloo (CA)

(72) Inventors: Erkang Wei, Waterloo (CA); Claudio Sa, Waterloo (CA); Pascale Walters, Waterloo (CA); James Nathan Swidersky, Kitchener (CA)

(73) Assignee: MappedIn Inc., Waterloo (CA)

( * ) Notice: Subject to any disclaimer, the term of this patent is extended or adjusted under 35 U.S.C. 154(b) by 117 days.

(21) Appl. No.: 18/655,910

(22) Filed: May 6, 2024

(65) Prior Publication Data

US 2024/0371061 A1 Nov. 7, 2024

Related U.S. Application Data

(60) Provisional application No. 63/500,079, filed on May 4, 2023.

(51) Int. Cl.
*G06T 11/60* (2026.01)
*G06F 30/12* (2020.01)
(Continued)

(52) U.S. Cl.
CPC .............. *G06T 11/60* (2013.01); *G06F 30/12* (2020.01); *G06F 30/13* (2020.01); *G06T 11/23* (2026.01);
(Continued)

(58) Field of Classification Search
CPC .. G06V 30/413; G06V 30/414; G06V 30/422; G06V 10/774; G06V 10/82;
(Continued)

(56) References Cited

U.S. PATENT DOCUMENTS

2014/0229426 A1* 8/2014 Gootee, III ............. G06F 30/13
707/608
2020/0116493 A1* 4/2020 Colburn ................ G06F 18/253
(Continued)

OTHER PUBLICATIONS

Dong et al., "Vectorization of Floor Plans Based on EdgeGAN", May 12, 2021, https://doi.org/10.3390/info 12050206 (Year: 2021).*

*Primary Examiner* — Kee M Tung
*Assistant Examiner* — Thang Gia Huynh
(74) *Attorney, Agent, or Firm* — Own Innovation Inc.; James W. Hinton; Sanjeevan Shivakumar

(57) ABSTRACT

System and methods for machine-assisted map editing tools are described. The system includes a machine-learning neural network trained to classify architectural data in a base map and generate a vectorized representation of the architectural data. The base map is presented to a user on a display interface for receiving user input tracing architectural features in the base map. The system then proposes or automatically places polygon objects representing the traced features in an editable map. The editable map may be superimposed on the base map on the display interface as it is drawn. The system may further detect the position of connections, classify enclosed spaces as room types. The machine-assisted map editing tools described herein provide a fast and efficient way for untrained users with no image/map editing experience to trace an architectural base map to generate an editable map of architectural features.

20 Claims, 16 Drawing Sheets

(51) Int. Cl.

| | |
|---|---|
| ***G06F 30/13*** | (2020.01) |
| ***G06T 11/23*** | (2026.01) |
| ***G06V 10/774*** | (2022.01) |
| ***G06V 10/82*** | (2022.01) |
| ***G06V 10/94*** | (2022.01) |
| ***G06V 30/413*** | (2022.01) |
| ***G06V 30/414*** | (2022.01) |
| ***G06V 30/422*** | (2022.01) |

(52) U.S. Cl.
CPC ............ *G06V 10/774* (2022.01); *G06V 10/82* (2022.01); *G06V 10/945* (2022.01); *G06V 30/413* (2022.01); *G06V 30/414* (2022.01); *G06V 30/422* (2022.01); *G06T 2200/24* (2013.01); *G06T 2210/04* (2013.01); *G06T 2210/12* (2013.01)

(58) Field of Classification Search
CPC .............. G06V 10/945; G06T 2200/24; G06T 2210/04; G06T 2210/12; G06T 11/60; G06T 11/203; G06F 30/12; G06F 30/13
See application file for complete search history.

(56) References Cited

U.S. PATENT DOCUMENTS

2020/0388059 A1* 12/2020 Hartfiel ................... G06T 7/155
2020/0402192 A1* 12/2020 Dahm .................. G09B 29/006

* cited by examiner

400

450

700

SYSTEM AND METHODS FOR MACHINE-ASSISTED MAP EDITING TOOLS

TECHNICAL FIELD

The embodiments disclosed herein relate to creating maps from architectural drawings, and, in particular to systems and methods for machine-assisted map editing.

INTRODUCTION

Traditional digital map creation tools are essentially drawing tools, allowing a user to draw lines, shapes, and other features with an input device (e.g., a mouse or stylus). This is often done by tracing an existing drawing (aka a "base map") or extracting certain elements of the base map if it is vector data. To trace a map, a human user manually draws the walls, the doors, stairs, and other features using drawing tools such as Adobe Illustrator®, AutoCad®, or GIS tools such as ESRI ArcGIS® by tracing satellite imagery. Creating a map in this traditional way is time consuming and prone to human error.

Architectural drawings and floor plans may be provided in a plurality of formats. Frequently, architectural drawings or floor plans are provided in simple image format (e.g., bitmap, .jpeg, .png), generated from a computer-aided-drafting (CAD) system, image editing program, such as Adobe Photoshop™, or scanned from a hardcopy document. Such simple format images may be easily read by trained individuals, however, the variety of formats, notation styles and architectural symbols may result in difficulties for untrained individuals to read. Also, the individual must be trained to use the CAD or image editing software.

It may be advantageous to convert simple format architectural plans, or scanned architectural drawings, to more machine-readable formats, as this may enable certain functions, such as the conversion of the base map to a digital map for editing purposes.

Accordingly, there is a need for new and improved systems and methods for machine-assisted map editing that makes map creation significantly faster and more efficient for an average user with no CAD/image software experience to create a compelling digital map of indoor spaces.

SUMMARY

The machine-assisted map editing tools described herein provide a fast and efficient way for untrained users with no image/map editing experience to trace an architectural base map to generate an editable map of architectural features. The base map may be provided as a CAD file, an image file or a scanned file of a hardcopy architectural drawing.

According to some embodiments, there is a method for machine-assisted map editing. The method comprises classifying architectural data in a base map by a trained machine learning neural network, generating a vectorized polygon representation of the classified architectural data, presenting the base map on a display interface, receiving user input tracing an architectural feature in the base map and proposing or automatically placing a polygon object representing the traced feature in an editable map. The base map may be presented on a display interface to the user on with the editable map being superimposed on the base map.

The method may further comprise training the neural network using a paired set of training images including a set of base map images as inputs and a set of vectorized polygon representations as outputs, wherein each base map image is associated to a vectorized polygon representation.

The method may include receiving user input modifying the polygon object, updating the editable map to show the modified polygon object and feeding back the user input modifying the polygon object to the neural network to further train the neural network to automatically place the polygon object correctly.

The method may further comprise detecting connections in the base map by the trained neural network, automatically placing the connections in the editable map; and, assigning a floor span for each connection.

The method may further comprise identifying an enclosed area in the editable map, classifying polygon objects, symbols and/or text within the enclosed area by the neural network and assigning a room type for the enclosed space based on the classification.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Figure 1:
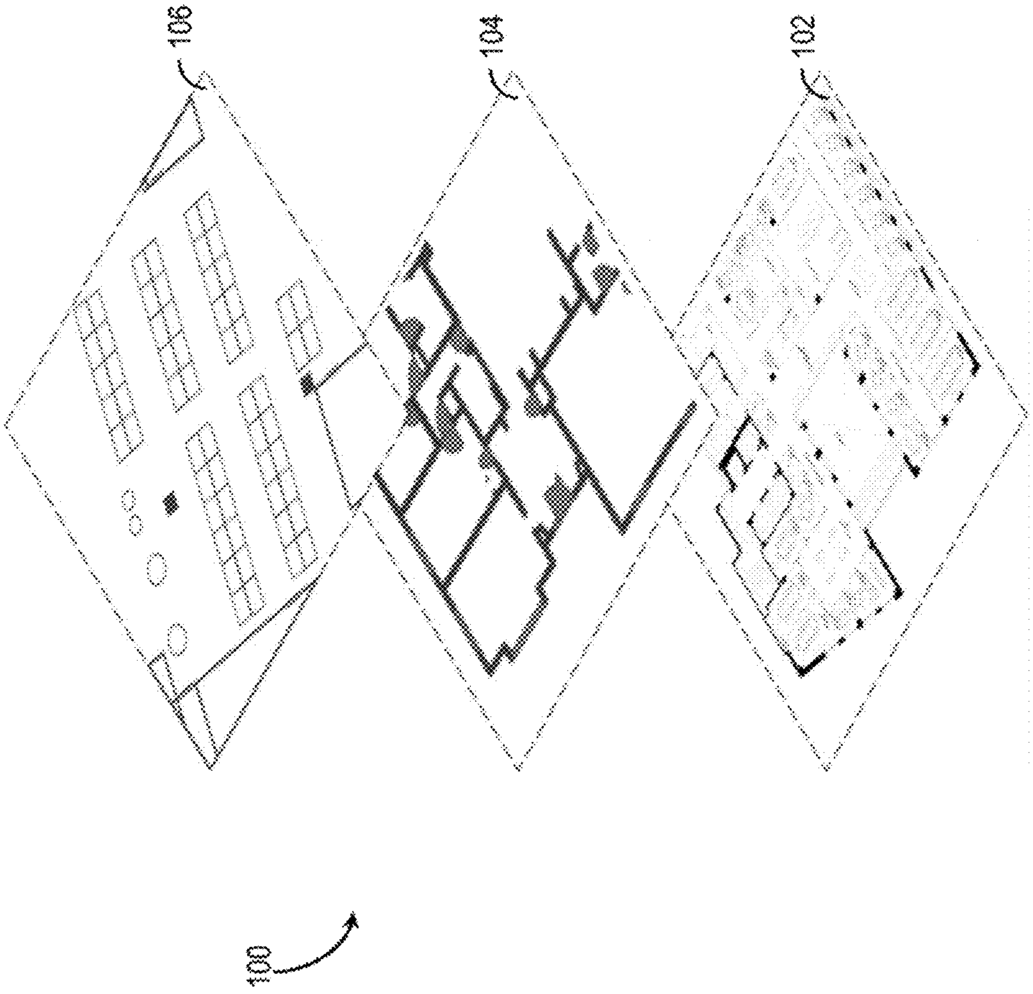
FIG. 1 is a diagram of a machine-assisted map editing tools, according to an embodiment.

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

One or more systems described herein may be implemented in computer programs executing on programmable computers, each comprising at least one processor, a data storage system (including volatile and non-volatile memory and/or storage elements), at least one input device, and at least one output device. For example, and without limitation, the programmable computer may be a programmable logic unit, a mainframe computer, server, and personal computer, cloud-based program or system, laptop, personal data assistance, cellular telephone, smartphone, or tablet device.

Each program is preferably implemented in a high-level procedural or object-oriented programming and/or scripting language to communicate with a computer system. However, the programs can be implemented in assembly or machine language, if desired. In any case, the language may be a compiled or interpreted language. Each such computer program is preferably stored on a storage media or a device readable by a general or special purpose programmable computer for configuring and operating the computer when the storage media or device is read by the computer to perform the procedures described herein.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

The following relates to systems and methods for machine-assisted digital map editing tools. The systems and methods described herein may be used to create a editable digital map from an architectural drawing file (e.g., CAD file) and image file (e.g., a bitmap, a JPEG or a PNG file) or a scanned architectural drawing file (e.g., a PDF file).

Referring to FIG. 1, shown therein is a diagram of machine-assisted map editing tools 100, according to an embodiment. An architectural drawing containing architectural plan data, referred to herein as a base map 102, is traced by a user to create an editable digital map 106 of polygon objects representing the architectural data in the base map 102. Generally, the base map 102 comprises architectural data depicting an indoor space i.e., a floor plan. The base map 102 may be an architectural design file (e.g., a CAD file), a simple image file (e.g., a bitmap, a .jpeg, a .png file) or a file of a scanned hardcopy architectural drawing (e.g., a .pdf file).

The base layer 102 is presented to the user on a display interface (e.g., a monitor or a touchscreen) and traced by a user using an input device (e.g., a mouse or a stylus) to create the editable map 106. The editable map 106 may be superimposed on the base map 102 as it is traced by the user.

An invisible machine learning (ML) layer 104 operates between the base map 102 and the editable map 106 to generate vectorized polygons for placement in the editable map 102. Vectorized polygon objects representing the architectural data may advantageously be scaled infinitely without loss of quality, and may be easily parsed by machine, to create the editable digital map 106, 3D models and more, for various applications.

The ML layer 104 incorporates a trained ML model (FIG. 8) that processes the base map 102, to detect the location of architectural features such as walls, doors, windows, stairs, elevators, desks, sinks, toilets, etc., and uses this data to allow the drawing tools for the editable map 106 to become "smart" drawing tools. For example, as the user traces a wall on top of the base map 102, the ML layer 104 can automatically suggest or place the door for the user in the editable map 106 if the wall intersects the door location generated by the ML model. In other words, because the ML layer 104 already knows (or predicts) where all the doors, windows, elevators, etc. are, the drawing tools can utilize this data to make smart drawing tools.

Compared to existing map editing tools, the smart machine-assisted map editing tools described herein can significantly make it faster and more efficient for drawing a map by automating some or all steps that would typically have to be done manually be a user. For example, manual steps of 1) drawing a wall with a first drawing tool and 2) adding an entrance to the wall with a second drawing or selection tool can be combined and automated as described below. In addition, according to various embodiments, the ML layer 104 may provide smart tools for: snapping wall vertexes (including the first one that is traced) together to form walls; automatically styling walls/objects based on the part of the base map 102 they are being drawn over; and/or suggest tooling or editing features based on the base map 102.

Different from traditional "pure" machine learning tools, the user can confirm or modify smart tool operations performed by the ML layer 104 which is fed back into the ML model. In this regard, user input reduces the problem of false positives/negatives by giving immediate feedback that can be used to correct or further train the ML model. Overall, this mitigates the need for perfect accuracy in the ML model.

Figure 2A:
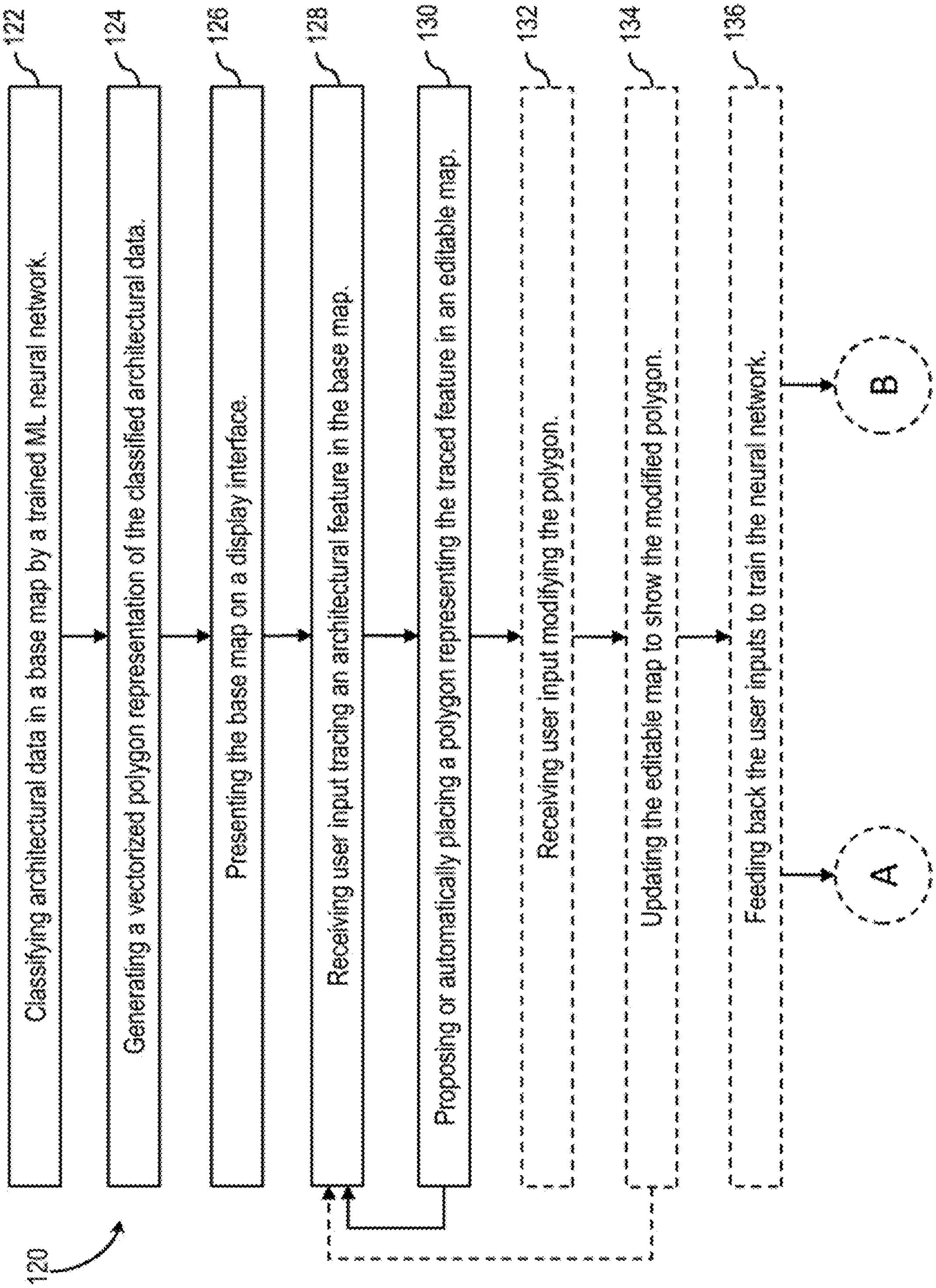
FIGS. 2A-2B is a flow chart of a method for machine-assisted map editing, according to an embodiment.

Referring to FIG. 2A, shown therein is a flowchart of a method 120 for machine-assisted map editing, according to an embodiment. The method 120 may be performed using a ML model (FIG. 8) and a map editing system (FIG. 9) described below.

At 122, architectural data in a base map is classified by a trained ML neural network.

Figure 3:
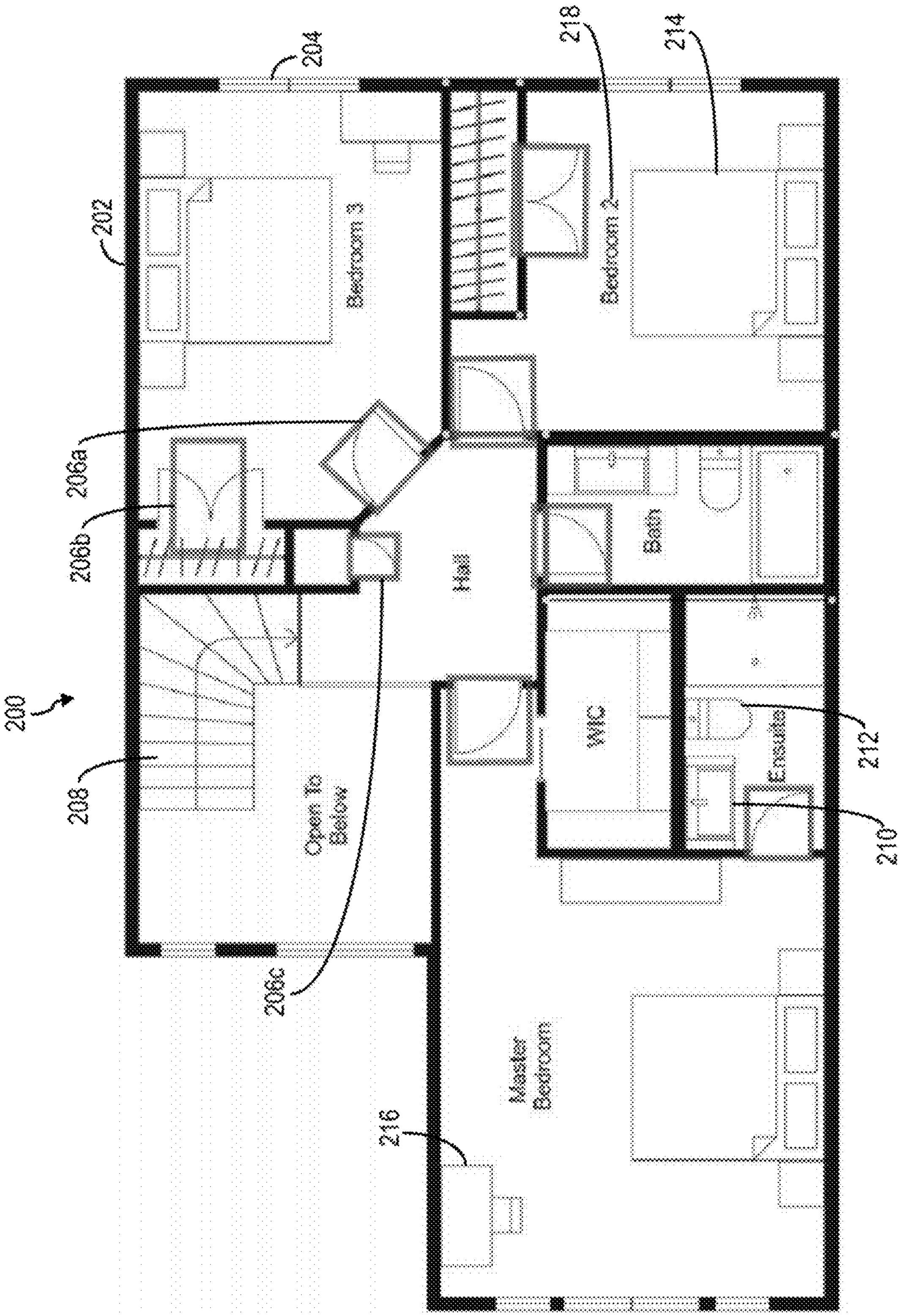
FIG. 3 is an exemplary base map.

An exemplary base map 200 is shown in FIG. 3. The architectural data in the base map 200 comprises lines, markings and/or symbols indicating the position of architectural features including walls 202, windows 204 and doors 206*a*, 206*b*, 206*c*. The base map 200 includes markings or symbols indicating the position of connections 208 (e.g., stairs, elevators, etc.) that connect to other spaces/areas not shown in the base map 200. The base map 400 further includes markings or symbols indicating the position of fixtures such as toilets 210, sinks 212, and furniture such as beds 214 and tables 216. The markings in the base map 200 may further include text 218 or alphanumeric codes for describing the spaces/areas and features depicted in the base map 200.

The ML neural network is preferably a generative adversarial network (GAN) trained to classify markings or symbols in the base map as architectural features using paired training set data. For example, the ML neural network is trained to recognize various markings or symbols in the base map 200 that indicate the location of doors 206*a*, 206*b*, 206*c* and classify those features as doors. In the same manner, the ML neural network is trained to recognize walls 202, windows 204, connections 208, etc.

In some base maps 200, distortion or artifacts (not shown in FIG. 2) may be present within the architectural plan data. Such distortion or artifacts may originate from the application of lossy compression schemes to the architectural plan data. In some examples, architectural plan data may be generated by scanning hard copy architectural plans using an image scanner. In such examples, distortion or artifacts may be imparted into electronic architectural plan data, as hard copy architectural plans may comprise damage, dust or other debris that may be translated to the electronic architectural plan data during the scanning process. Preferably, the ML neural network is trained to detect architectural features, such as windows 204, walls 202, doorways 206, connections 208, sinks 210, toilets 212, beds 214 and desks 216 while disregarding distortion, degradation and artifacts.

Figure 4A:
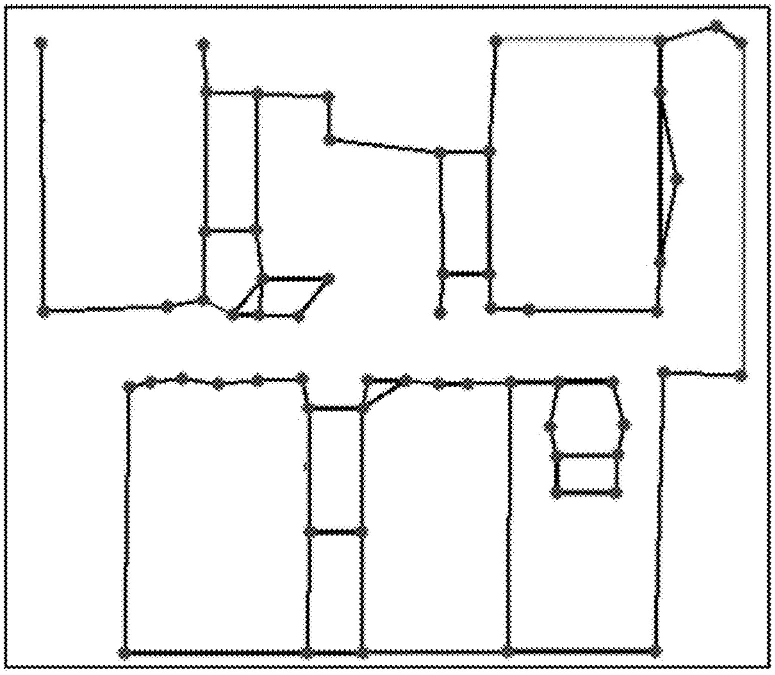
FIGS. 4A-4B are an exemplary vectorized representations of architectural data, according to several embodiments.
Figure 4B:
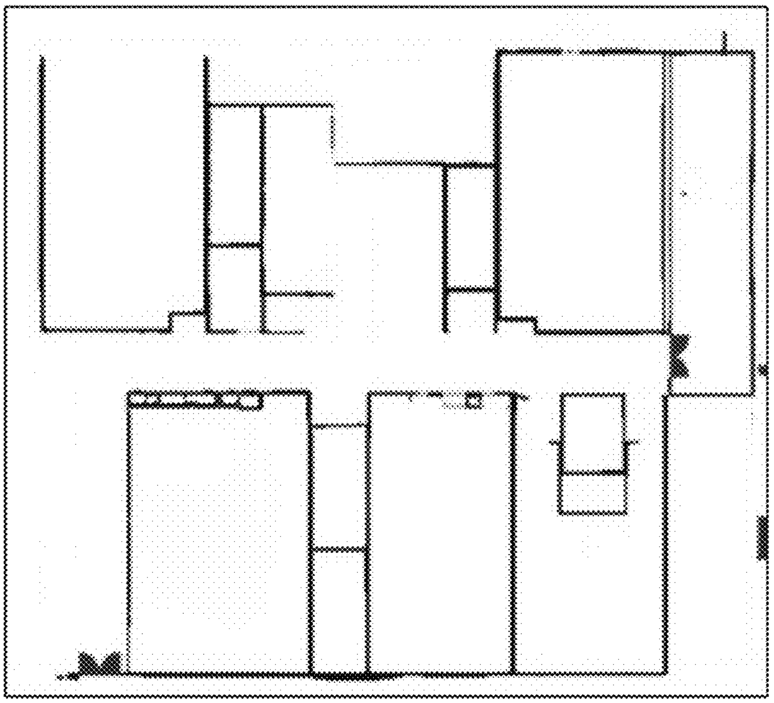

Referring back to FIG. 2A, at 124, a vectorized polygon representation of the architectural data is generated and stored in a memory. An exemplary representation of architectural data as a plurality of vectorized polygons 400, 450 at step 124 is shown in FIGS. 4A-4B. FIG. 4B shows a raw polygon output from the GAN after classification of the architectural features in the base map. The polygon output is further processed to convert the polygons into vectorized form—line strings for walls and polygon bounding boxes for windows, doors and other architectural features/objects. FIG. 4A shows an exemplary vectorized line string representation of detected walls in the base map.

Generally, all architectural features classified at step 122 are represented as vectorized polygons defined by at least 3 points (vertices) in a coordinate system. Variables for different classes of architectural features/polygon objects are defined with variable values suited to that particular class. For example, walls 202 in FIG. 3 are objects of a "wall" class and may be defined as polygons with the following variables: minimum wall length; maximum wall length; maximum vertex snap distance; maximum wall angle snap distance; maximum wall close distance.

Minimum wall length defines the minimum length for a line in the base map to be classified as a wall. If a detected wall is below the minimum wall length it may be disregarded. Max door length defines the maximum size for a door. If a detected door is too large it may be disregarded as a door. The maximum vertex snap distance defines that if a detected door is only a foot wide, it is snapped to a minimum door width. Maximum wall snap distance defines that if an angle between 2 walls is within a threshold of a major angle, for example 2 degrees away from 90 degrees, it is snapped to 90 degrees. The maximum wall close distance defines that if two disjointed walls are within a threshold distance of each other, they can be snapped together into a single wall.

Referring again to FIG. 2A, at 126, the base map is presented to a user on a display interface for the user to trace over the features in the base map to produce an editable map (FIGS. 5A-5D). The editable map is shown superimposed over the base map on the display interface to aid the user to trace the base map features.

At 128, a user input tracing an architectural feature in the base map is received. The user input includes the position(s) or coordinate(s) of the trace made by the user in the base map. Tracing an architectural feature may include only tracing a portion of the entire architectural feature shown in the base map. For example, the user input may be tracing a section of a wall. According to some embodiments, it is preferred for the user to start tracing at a vertex of the architectural feature (e.g., a corner or an end of a wall) as described below. According to other embodiments, the user input may include tracing an area around the architectural feature (e.g., drawing a box or a circle around a window).

At 130 a polygon object representing the architectural feature traced at step 128, is proposed for placement, or automatically placed in the editable map. Steps 128 and 130 may be performed concurrently so that the polygon object is placed in the editable map as it is being traced by the user, or immediately thereafter. The position/coordinates of the traced feature in the base map corresponds to the position/coordinates of that same feature in the vectorized polygonal representation of the architectural data generated at step 124 and stored in the memory. Accordingly, the map editing system knows (or has predicted) the polygon object that corresponds to the feature that is traced, and places the polygon object in the editable map at the position/coordinates of the traced feature.

Following step 130, the method 120 may cycle through steps 128 and 130 until all walls in the base map are traced and placed in the editable map. The user does not need to trace each and every architectural feature in the base map separately as described below.

Referring to FIGS. 5A-5D, shown therein is a display interface 500 showing automatic placement of a polygon object in an editable map, according to an embodiment. The display interface 500 shows the editable map (dark grey lines) superimposed on the base map (light grey lines). While FIGS. 5A-5D describe the automatic placement of walls and doors, it should be understood that the same techniques can be applied for other architectural features depicted in base maps (e.g., windows, furniture, fixtures, etc.).

Figure 5B:
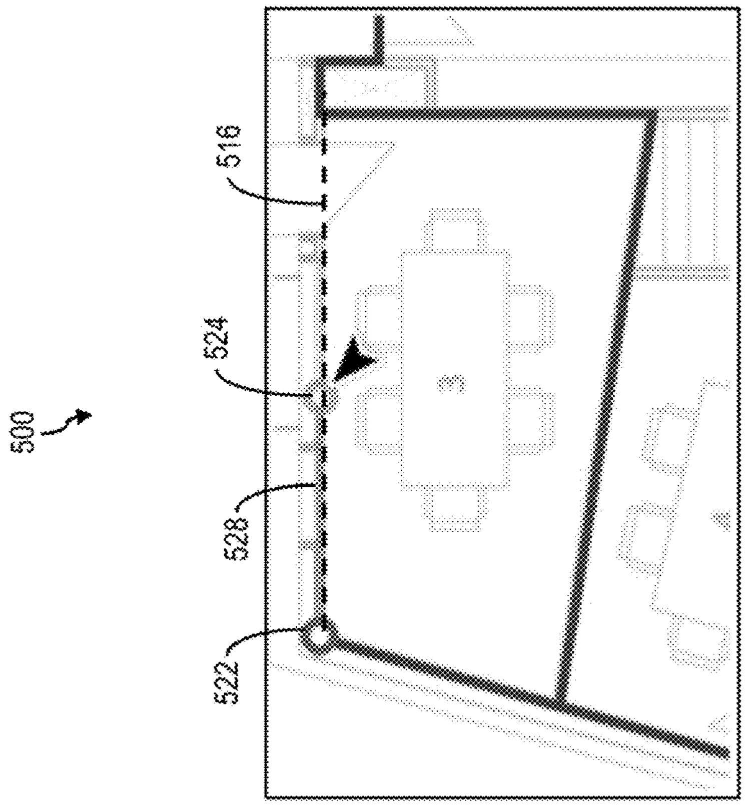
FIGS. 5A-5D are display interfaces showing automatic placement of polygon objects in an editable map, according to an embodiment.
Figure 5A:
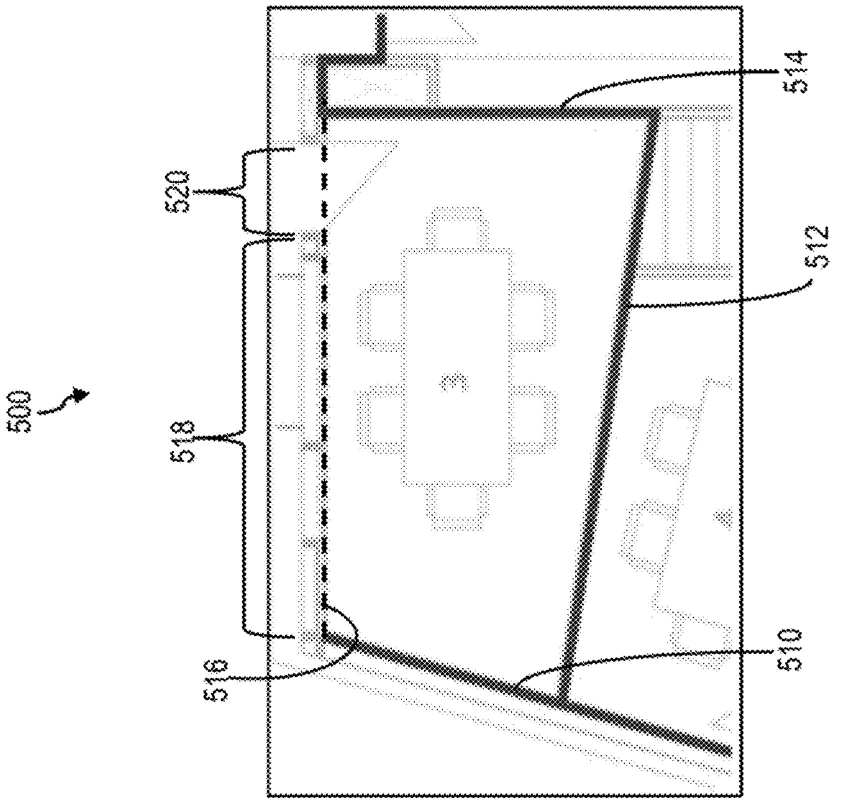

In FIG. 5A, the display interface 500 shows three walls 510, 512, 514 in the editable map traced by the user that are superimposed on the base map. A section 516 of the base map has not yet been traced by the user. The untraced section 516 includes a wall 518 and a door 520. To trace the wall 518 and the door 520, the user does not have to trace each separately, and can simply trace a line over the untraced section 516 following the wall 518 and the map editing system will place polygons for each traced feature 518, 520 in its appropriate position in the editable map. This makes map tracing and drawing much easier and efficient for untrained users.

In FIG. 5B, the display interface 500 shows a user tracing over the untraced section 518 (e.g., at step 128 in the method 120). A trace 528 is started at an end 522 of the untraced section 518. As the user traces along the untraced section 518, the progress of the trace 528 is shown between the starting point, at end 522, and a point 524 where the trace 528 currently is.

Figure 5D:
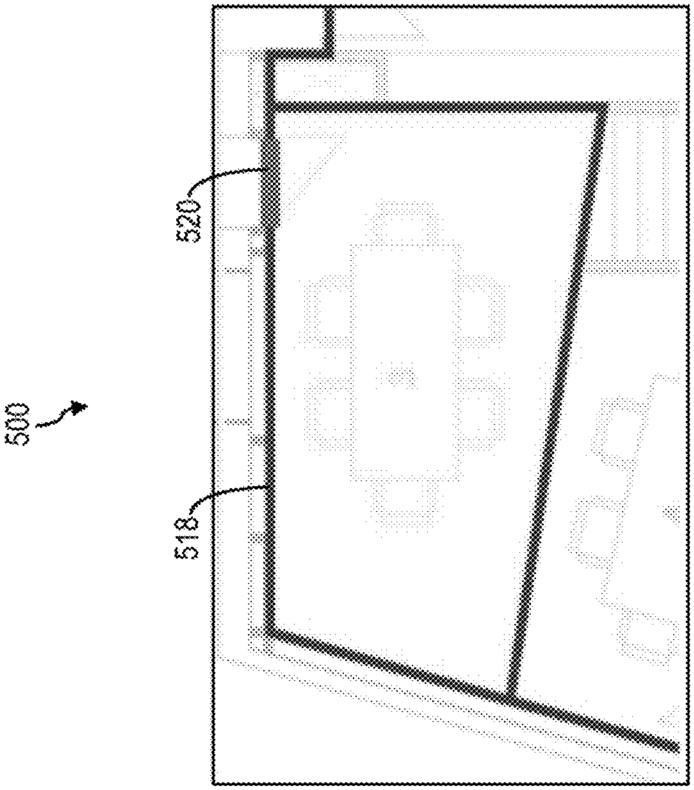
Figure 5C:
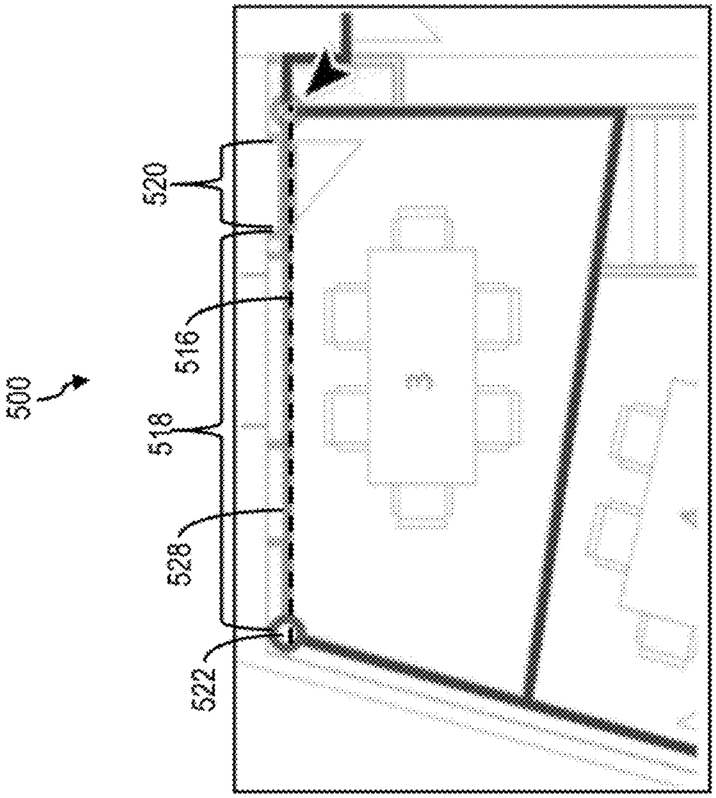

In FIG. 5C, the display interface 500 shows the user continue the trace 528 of the untraced section 516. As the user traces over the wall 518 and the door 520, the map editing system uses computer vision techniques to identify corners/end points and recognizes that the wall 518 intersects with the door 520 in the polygon representation of the base map and populates the door polygon in the wall. The display interface 504 shows a proposed placement for the wall 518 and the door 520 In the editable map, based on the polygonal representation of those same features 518, 520 from the base map. The proposed placement for the wall 518 and the door 520 may be displayed in different colors. Generally, different architectural features/polygon types will appear in a different color (e.g., blue walls, orange doors, green windows, etc.).

In FIG. 5D, the display interface shows the automatic placement of the wall 518 and the door 520 in the editable map (e.g., at step 130 in the method 120) after the user has completed tracing the untraced section. According to some embodiments, before the wall 518 and door 520 are finally placed in the editable map, the display interface 500 may display a prompt (not shown) to the user to confirm or modify the proposed placement of the feature (e.g., at step 132 in the method 120). Given that the editable map is superimposed on the base map, the user can quickly and easily confirm whether the proposed door placement in the editable map is actually a door in the base map.

Referring back to FIG. 2, at 132, the user may correct or modify the polygon object automatically placed in the editable map.

At 134, the editable map may be updated to show the modified polygon object depending on whether a modification was received at step 132. Following step 134, the method 120 cycles through steps 128, 130 (and in some cases steps 132 and 134) until all architectural features in the base map are traced and placed in the editable map.

At 136, the user inputs correcting or modifying the polygon objects at step 136 are fed back to the ML model (FIG. 8) to further train the neural network to automatically place polygon objects in the editable map correctly.

Figure 2B:
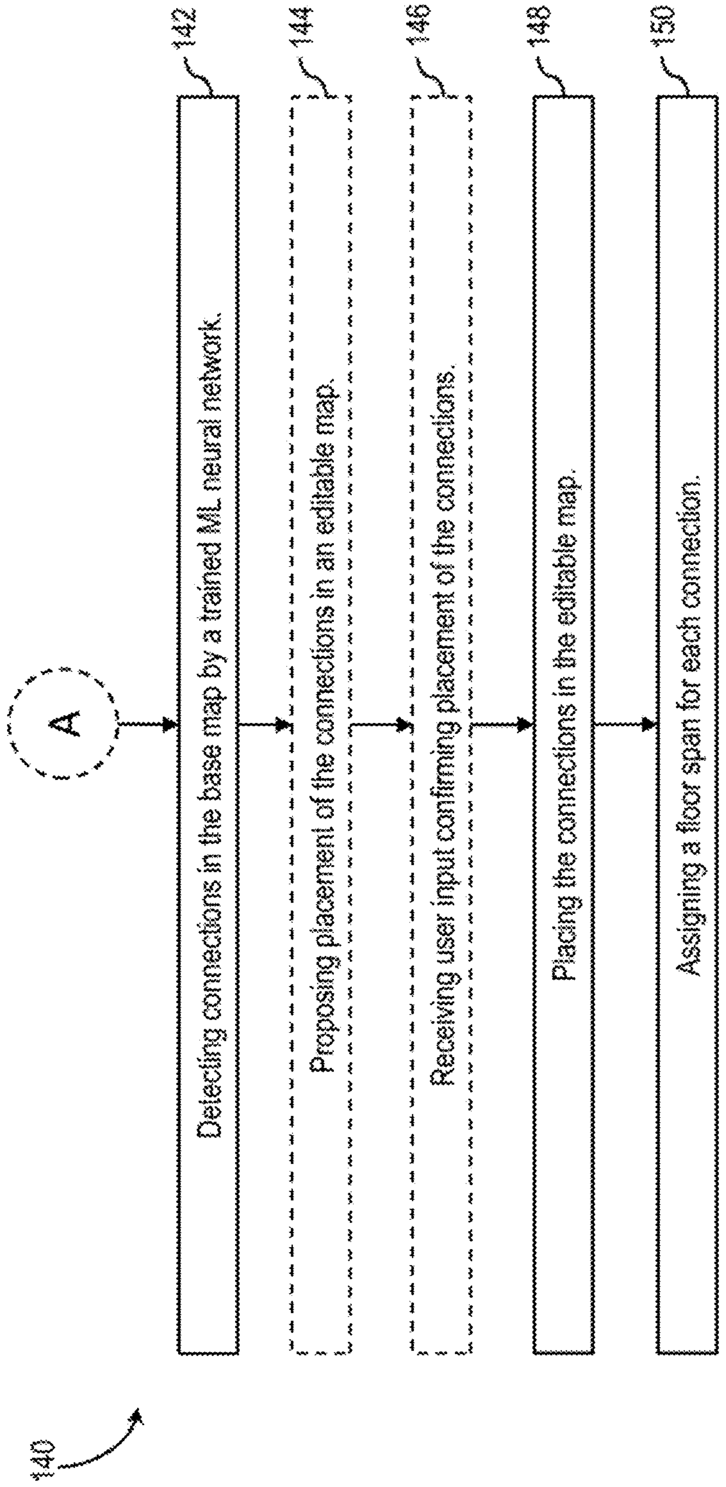

Referring to FIG. 2B shown therein is a method 140 for machine-assisted map editing. According to various embodiments the method 140 may be a continuation of the method 120 (FIG. 2A) or performed separately. Generally, the method 140 is only performed after all walls (e.g., wall 202 in FIG. 3) in the base map are traced and placed in the editable map. While the method 140 described below pertains to connections, it should be understood that the method 140 can be applied to furniture (desks, tables, etc.) and fixtures (e.g., sinks, toilets, etc.) by training a ML neural network to detect and classify those features.

At 142, connections in the base map are detected by a trained ML neural network. Connections refer to stairways, elevators, walkways, or the like, that connect the area depicted in the base map to another floor or area not depicted in the base map. The ML neural network is preferably a GAN trained to classify lines, markings or symbols denoting connections in the base map using paired training set data. For example, the ML neural network may be trained to recognize lines, markings or symbols in the base map that indicate the location of connections.

At 144, in some embodiments, the connections detected in the base map are proposed for placement in the editable map. The position/coordinates of a connection in the base map corresponds to the position/coordinates of that same connection in the vectorized polygonal representation of the architectural data stored in the memory. Accordingly, the map editing system knows (or has predicted) the position of the connection, and proposes placement of the connection in the editable map.

At 146, in some embodiments, user input confirming placement of the connections is received. Given that the editable map is superimposed on the base map, the user can quickly and easily confirm whether the proposed connection placement in the editable map is actually a connection in the base map.

At 148, the connections are placed in the editable map.

Figure 6A:
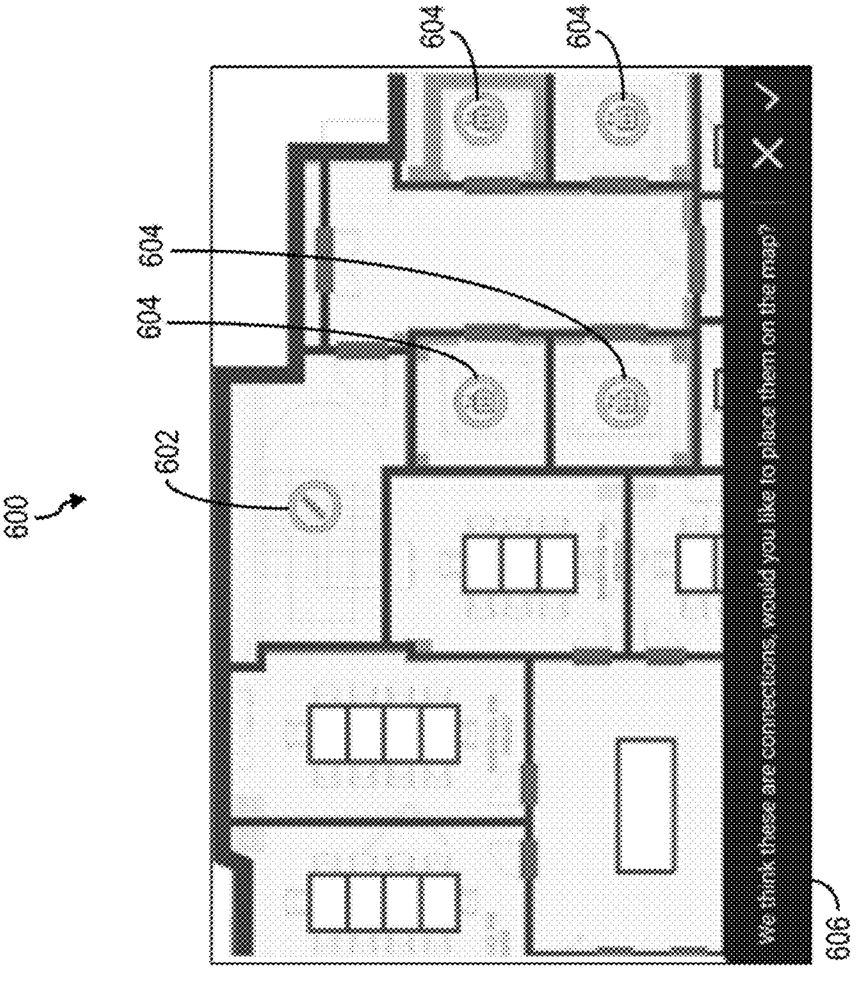
FIG. 6A is a display interface showing automatic placement of connections in an editable map, according to an embodiment.

Referring to FIG. 6A, shown therein is a display interface 600 showing placement of connections in an editable map, according to an embodiment. The display interface 600 shows the editable map (dark grey lines) superimposed on the base map (light grey lines). Connections in the editable map may be indicated with icons (as shown) or text. The connections include stairways 602 and elevators 604 detected in the base map by the ML neural network. According to some embodiments, the display interface 600 may display a prompt 606 to the user to confirm placement of the connections 602, 604 in the editable map.

Referring back to FIG. 2B, at 150, a floor span for each connection is assigned. Floor span refers to floors or areas not depicted in the base map that the connection reaches, for example, one or more floors above or below the floor depicted in the base map. The floor span may be assigned automatically by the ML model or by the user.

For automatic assignment of floor spans, the map editing system may be configured to align base maps to detect the same connection across floors within some expected proximity. For example, if an elevator is detected on floor 1 and 2 (i.e., detected in the base maps of floors 1 and 2) and it is in the same position on both floors 1 and 2, the elevator it is accordingly assigned a span from floor 1 to floor 2. Automatic floor span assignment for stairways is done by looking for the connection's position to fall within some range to account for the slope and direction of said slope. If a stairway connection is not present in an expected position on the floor above or the floor below, it is inferred that the stairway ended on the previous floor and the floor span is assigned accordingly.

Figure 6B:
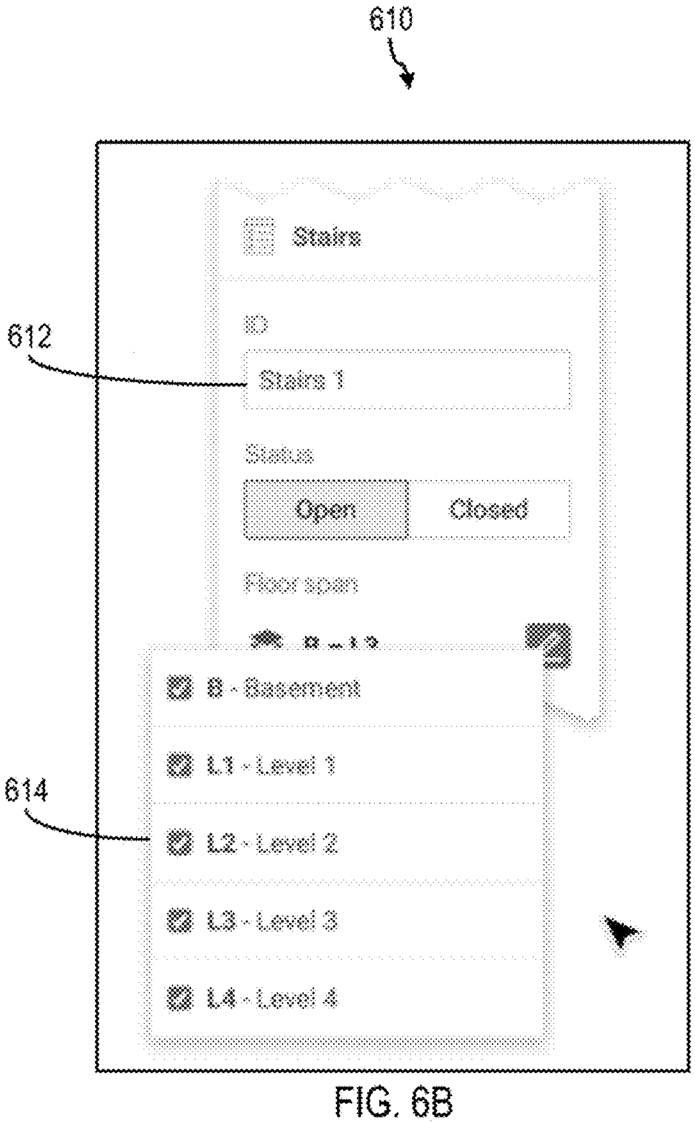
FIG. 6B, is a display interface showing floor span for a connection, according to an embodiment.

Referring to FIG. 6B, shown therein is a display interface 610 showing floor span assignment, according to an embodiment. The display interface 610 may be shown when a connection in the editable map is selected. The display interface 610 includes a connection identifier 612 for the selected connection. A selection pane 614 includes a list of floors or areas to which the connection connects to. The user may select or deselect floors in the selection pane 614 to assign one or more floors or areas to the connection.

Figure 2C:
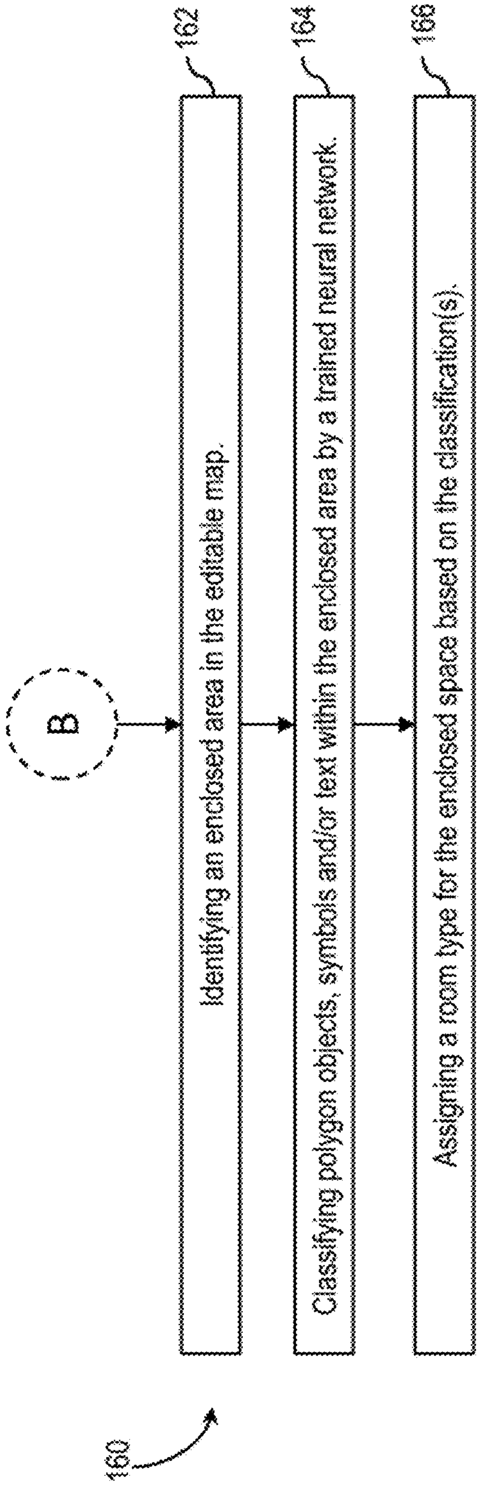
FIG. 2C is a flow chart of a method for automatically assigning a room type, according to an embodiment.

Referring to FIG. 2C, shown therein is a flow chart of a method 160 for automatically assigning a room type. According to various embodiments, the method 160 may be a continuation of the method 120 (FIG. 2A) or performed separately. Generally, the method 160 is only performed after all walls (e.g., wall 202 in FIG. 3) in the base map are traced and placed in the editable map.

At 162, an enclosed area in an editable map is identified. Generally, an enclosed area is an area in the editable map that is completely traced and bounded by walls on four sides. According to various embodiments, enclosed areas may be identified based on other criteria. For example, the enclosed space may have certain minimum/maximum dimensions, have at least one door, etc.

At 164, polygon objects within the enclosed space are classified by a trained ML neural network. The ML neural network is preferably a GAN trained to classify markings or symbols denoting objects such as furniture (e.g., desks, beds, tables, chairs), fixtures (e.g., sinks, toilets, showers), or other objects (e.g., computers, equipment). The ML neural network may also be trained to classify text labels within the enclosed space in the base map.

Figure 7:
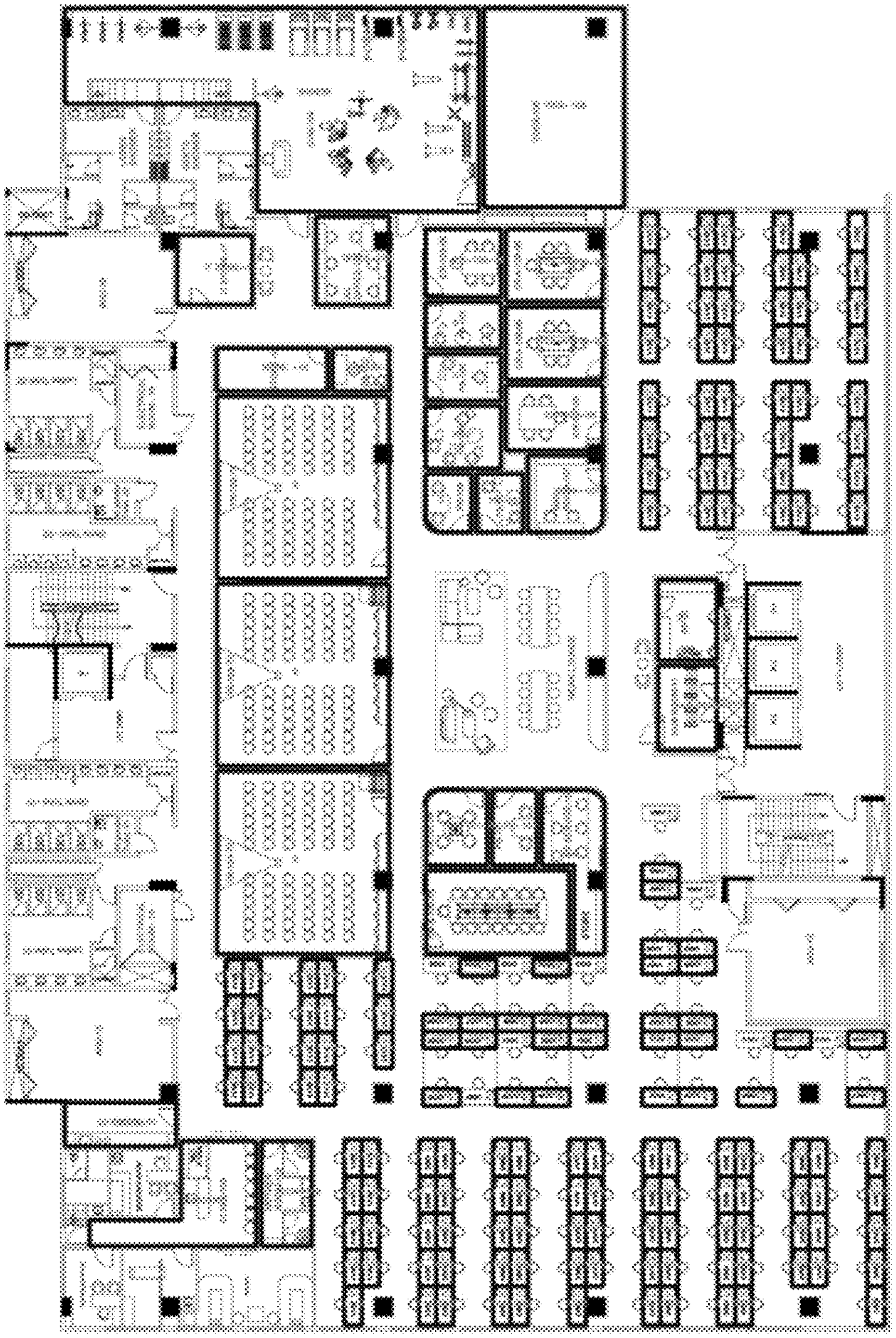
FIG. 7 is a display interface showing enclosed spaces, according to an embodiment.

Referring to FIG. 7, shown therein is an exemplary display interface 700 showing enclosed spaces in the editable map (dark grey lines) shown superimposed on the base map (light grey lines).

Referring again to FIG. 2C, at 166, a room type is assigned to the enclosed space based on the classified features contained therein. For example, an enclosed space with a washroom symbol may be assigned a room type of "washroom;" an enclosed space with a bed may be assigned a room type of "bedroom;" and enclosed space with a text label "kitchen" may be assigned a room type of "kitchen." Where multiple enclosed spaces of the same type are present, the enclosed spaces may be assigned a room type and a number (e.g., "bedroom 1," "bedroom 2," etc.).

Figure 8:
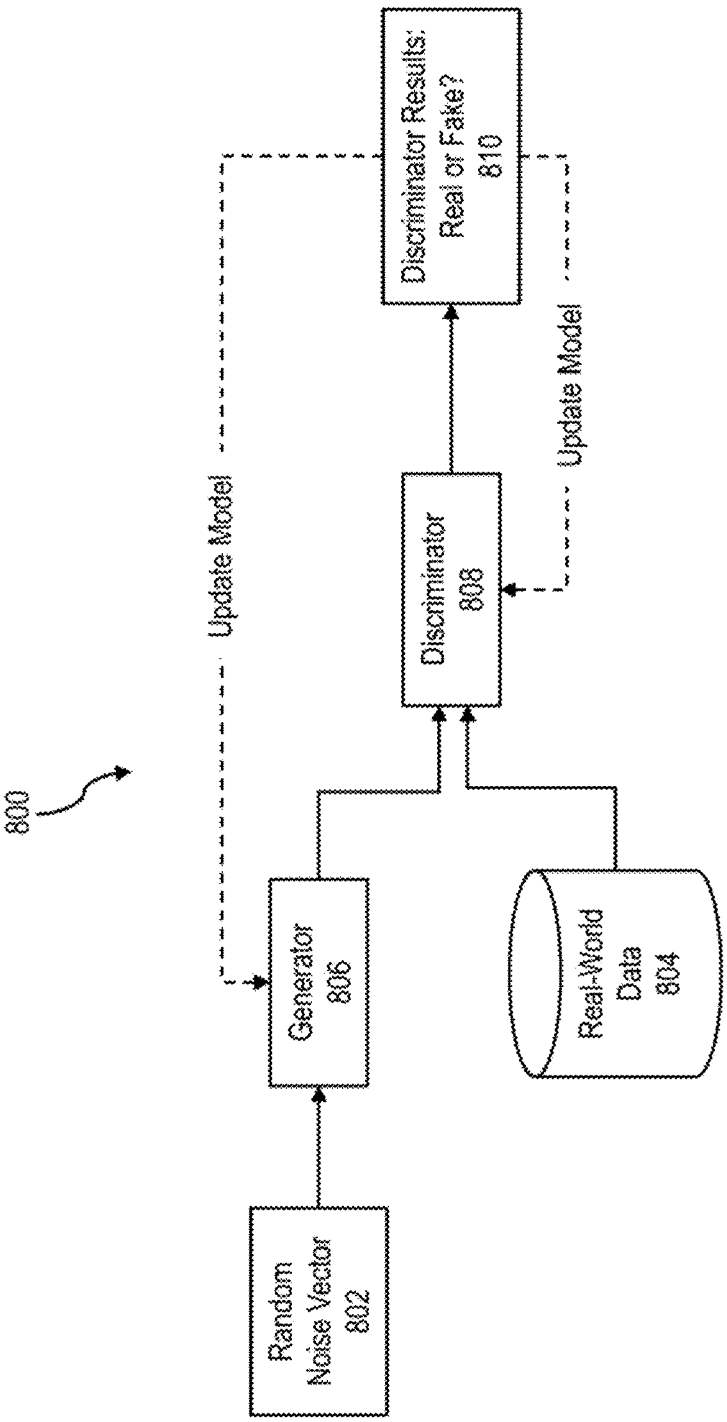
FIG. 8 is a diagram of a machine learning model, according to an embodiment.

Referring now to FIG. 8, pictured therein is a block diagram of a generative adversarial neural network (GAN) 800. The GAN 800 comprises a random noise vector 802, real world data input 804, generator 806, discriminator 808, and discriminator result 810, wherein generator 806 and discriminator 808 each comprise neural networks. Real world data 804 is inputted into the network 800. The generator 806 and discriminator 808 are trained using the real-world data 804. The GAN 800 may additionally comprise hyperparameters (not pictured), which may be tuned manually until the network 800 produces a result aligning with an operator's desire.

After training, the generator 806 is configured to generate a sample vectorized polygon representation upon command, or upon input of a random noise vector 802, and the discriminator 808 is configured to be provided with the sample vectorized polygon representation. The discriminator 808 may comprise a binary classification network, which is configured to output a binary determination (at 810) as to whether the provided sample is a real sample, as per provided real-world data 804, or a generated/incorrect sample, in comparison to the real-world data 804. The discriminator 808 result 810, as well as accompanying data, may be fed back to both the generator 806 and discriminator 808, such that the generator 806 may update parameters of its model, and iterate the generated sample.

The model 800 may be run continuously, until the discriminator 808 outputs a determination at 810, that the generated sample is "real", wherein the discriminator 808 is unable to discriminate between a real-world data 804 sample and the generated sample. At such a point, the sample is determined to be the final output of the model 800.

In the example of the methods 120, 140 and 160, a GAN such as the GAN 800 described above may be employed as the trained ML model. In some examples, a variation of a GAN, similar to GAN 800 may be employed in the methods 120, 140 and 160. For example, a GAN purposely designed for image style shifting or image to image translation may be applied. Such GANs are configured to convert an image from one style domain (e.g., the base map) to another style domain (e.g., the vectorized polygon representation), according to the provided paired training dataset.

According to some embodiments, pix2pixHD or a similar ML model or software package configured for image style transfer applications may be employed by methods 120, 140 and 160 as the ML model. Pix2pixHD comprises a GAN based machine learning model, which may synthesize high resolution images (e.g., up to 2048×1024 pixels), and may provide for image style translation functionality when provided with an appropriate paired image training set. The pix2pixHD generator component comprises groups of convolution layers, followed by groups of residual network layers followed by groups of deconvolution layers. The pix2pixHD discriminator component comprises a multiscale discriminator, wherein multiple discriminators are employed, each evaluating inputs at different scales, such that various receptive fields and levels of detail may be evaluated by the discriminator.

In some examples, wherein pix2pixHD is employed, hyperparameters may include number of iterations, number of decay iterations, learning rate, loadSize, fineSize, Adam Optimizer Momentum, BatchSize, and n_layers_D. In some examples, pix2pixHD hyperparameters may be configured such that number of iterations=200, number of decay iterations=200, learning rate=0.0002, loadSize=1024, fineSize, =512 Adam Optimizer Momentum=0.5, BatchSize=1, and n_layers_D=3. Such a configuration may result in good performance, and high-quality output. In other examples, hyperparameters may vary from the hyperparameters provided herein.

In examples wherein pix2pixHD, or a similar method is applied, a paired training set of images, may be provided to the GAN as real world data 804 at the training phase to train the model. For example, the user may collect a plurality of architectural plan data i.e., base maps. Preferably, the collection of base maps are relatively similar in style and configuration to the base maps that the user wishes to vectorize using the methods described herein. For example, if the base map that the operator wishes to vectorize comprise certain line styles to denote walls and windows, where the collection of base maps comprise images with similar or matching line styles, a training set may maximize the effectiveness of the methods described herein.

The user may generate corresponding vectorized polygon representations for each base map, by manually drawing, sizing and annotating polygon objects, resulting in a paired training set. Once the user has collected the plurality of paired training images, the paired training set may be provided to a ML model (e.g., GAN 800), to train the ML model.

Other ML models for: classification of architectural data in base maps, for example, detection of connections; identification of enclosed areas in editable maps; and classification of objects, symbols or text within enclosed areas may also be provided with the same general architecture as the GAN 800 and be trained in a similar manner as described above.

For example, a paired training set of images for classification of architectural features in base maps may be created by providing a first set of base maps images and a second set of the base map images manually labelled/annotated with pixel-wise classification of the architectural data therein to train the model to detect/identify walls, doors, windows, desks, tables, toilets, sinks, etc.

After training the ML model, instead of inputting random noise vector 802 into generator 806, a base map image may be inputted. The generator 806 may then generate an output corresponding to the inputted image. For example, a base map, such as FIG. 3 may be provided as an input to the generator 806. The generator 806 may generate a corresponding vectorized polygon output, and provide the output to the discriminator 808. The network 800 may iterate until the discriminator 808 is unable to differentiate between training images and generated images provided by the generator 806.

Figure 9:
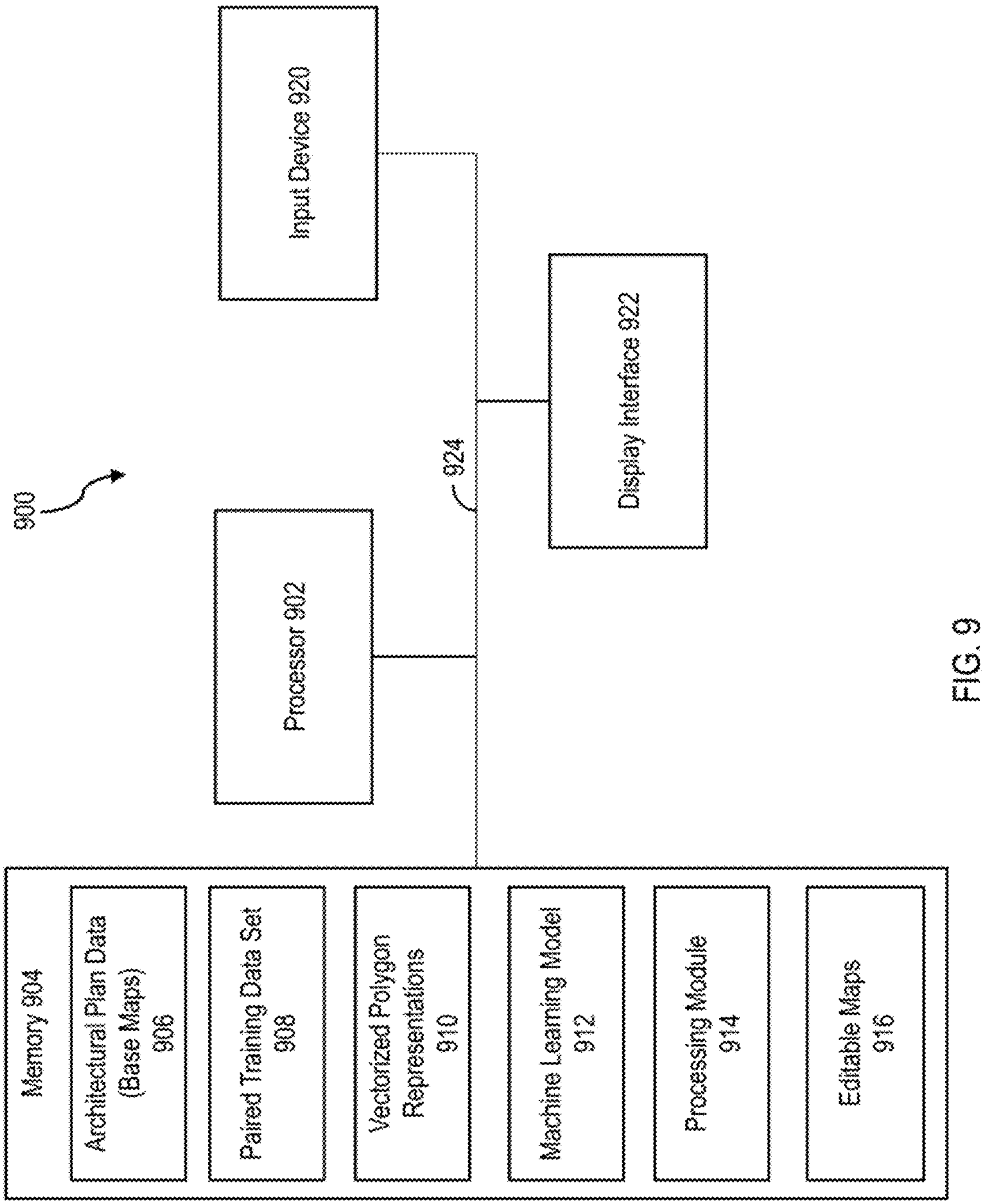
FIG. 9 is a is a diagram of a map editing system, according to an embodiment.

Referring now to FIG. 9, pictured therein is a block diagram of a map editing system 900, according to an embodiment. The map editing system 900 may be configured to perform the methods 120, 140, 160 described above. Generally, the system 900 may be embodied by a computer, a laptop computer, a server, a tablet device or a smartphone.

The system 900 comprises a memory 904 and at least one processor 902. According to some embodiments, the at least one processor 902 may be any processor known in the art for executing machine instructions. According to an embodiment, the at least one processor 902 is at least one GPU specifically configured for image processing and/or specifically configured to execute GAN 800. According to an embodiment, the system 900 includes a first processor configured to execute the generator 806 neural network and a second processor configured to execute the discriminator 808 neural network.

The memory 904 may be any form of memory known in the art that may store machine instruction data, and input/output data, such as training set data, input architectural plan data, and output translated architectural plan data. Memory 904 and processor 902 are configured such that they may readily communicate with and pass data to one another.

The system 900 comprises a display interface 922 (e.g., a touchscreen, a monitor or other display screen) and an input device 920 (e.g., a mouse, a stylus). A system bus 924 and/or one or more interface circuits (not shown) couple the processor 902 to the memory 904 and the other components 920, 922.

The memory 904 stores architectural plan data 906, one or more paired training data sets 908, vectorized polygon representations 910, one or more machine learning models 912, a processing module 914 and editable maps 916.

Architectural plan data 806 may comprise base maps, exemplified by the base map 200 in FIG. 3.

Figure 10A:
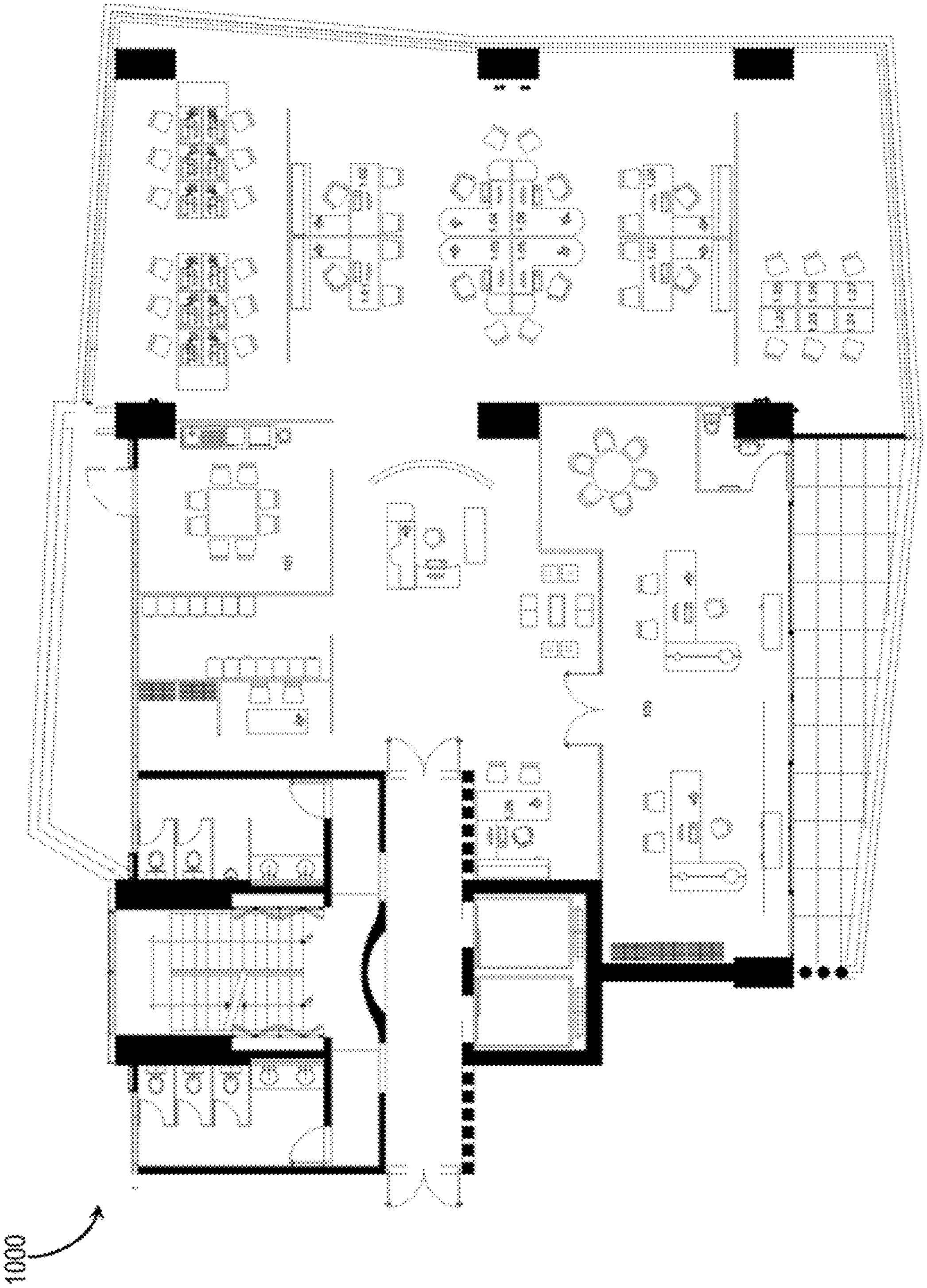
FIGS. 10A-10B are exemplary paired training images for training a machine learning neural network, according to an embodiment.
Figure 10B:
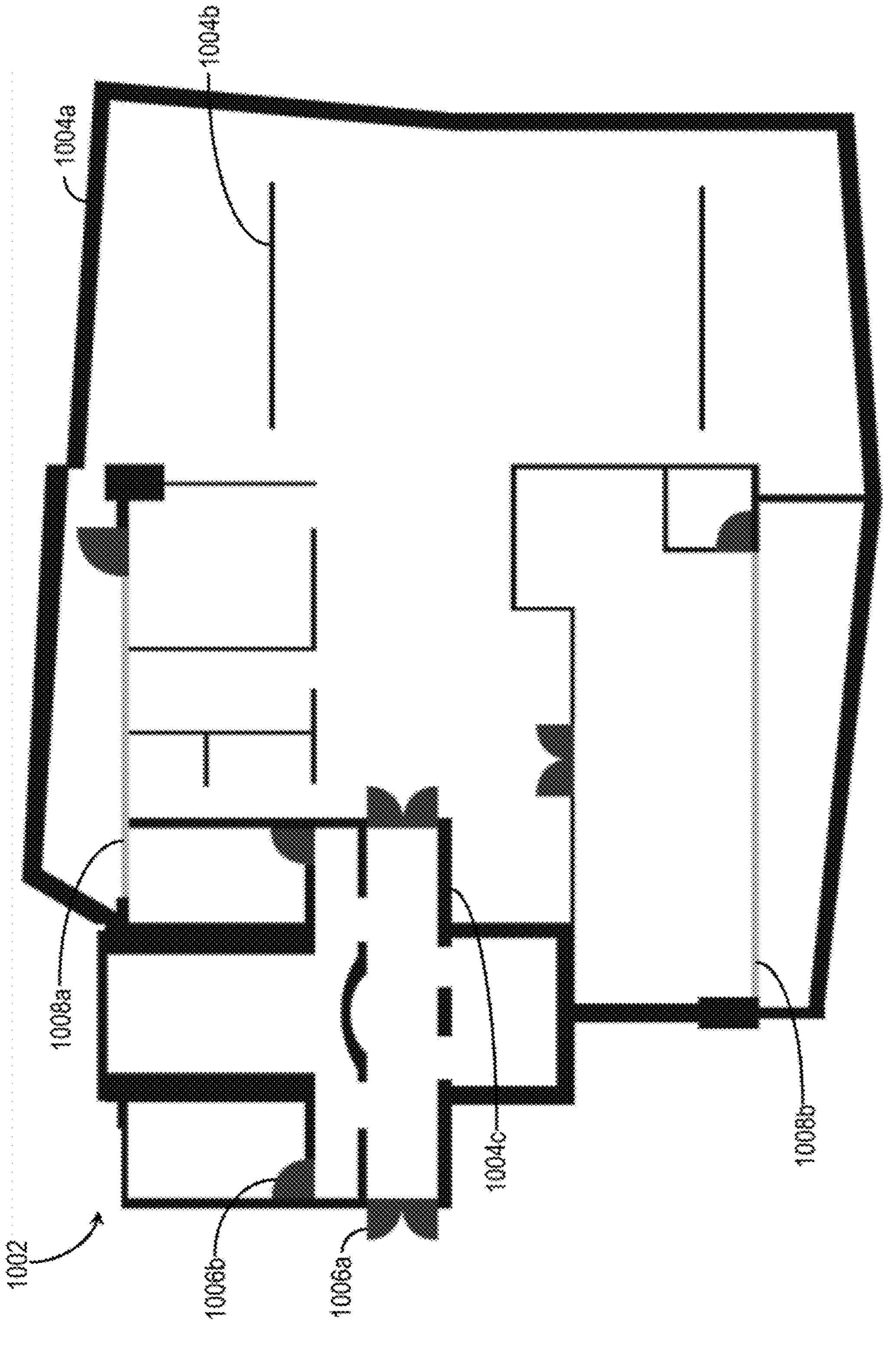

Paired training data set 808 may comprise a paired set of base maps and vectorized polygon representations. Referring to FIGS. 10A and 10B, shown therein is an exemplary paired base map 1000 (FIG. 10A) and a vectorized polygon representation 1002 (FIG. 10B), according to an embodiment. The vectorized polygonal representation 1002 may be annotated by the trainer to label the various classes of architectural feature, such as walls 1004*a*, 1004*b*, 1004*c*, doors 1006*a*, 1006*b* and windows 1008*a*, 1008*b* to train the machine learning model 912 to correctly classify those features.

The vectorized polygon representations 910 may comprise the output of the machine learning model 912. For example, translated architectural plans 810 may resemble translated architectural plan 204 of FIG. 3.

The machine learning model 912 may comprise a machine learning model configured to accept a base map 906 as an input, and output a vectorized polygon representation 910. In some examples, the machine learning model 912 may comprise a generative adversarial network, like the network 800 shown in FIG. 8. In some examples, the generative adversarial network may comprise pix2pixHD.

The processing module 914 may comprise a software module which provides smart map editing tools to the user for operations described above with reference to the methods 120, 140 and 160. For example, the processing module 914, may render the editable map and superimposed the editable map over the base map on the display interface 922 when the user traces architectural features in the base map with the input device 920.

While the above description provides examples of one or more apparatus, methods, or systems, it will be appreciated that other apparatus, methods, or systems may be within the scope of the claims as interpreted by one of skill in the art.

The invention claimed is:

1. A method for machine-assisted digital map editing, comprising:

classifying architectural data in a digital base map by a trained machine learning neural network;

generating a vectorized polygon representation of the classified architectural data, the vectorized polygon representation including polygon objects representing architectural features in the base map;

presenting the base map on a display interface;

receiving user input manually tracing a section of the base map, the section including a first architectural feature of a first type and a second architectural feature of a second type;

identifying a first polygon object and a second polygon object representing the first architectural feature and the second architectural feature, respectively, in the vectorized polygon representation; and proposing or automatically placing the first polygon object in a first color, and the second polygon object in a second color, at respective positions in an editable map corresponding to respective locations of the first architectural feature and the second architectural feature in the base map.

2. The method of claim 1, further comprising:

training the neural network using a paired set of training images, comprising:

a set of base map images as inputs; and a set of vectorized polygon representations as outputs, wherein each base map image is associated to a vectorized polygon representation.

3. The method of claim 1, further comprising:

receiving user input modifying the first polygon object and/or the second polygon object; and updating the editable map to show the first polygon object and/or the second polygon object, as modified.

4. The method of claim 3, further comprising:

feeding back the user input modifying the first polygon object and/or the second polygon object to the neural network to further train the neural network to automatically place the polygon objects in the editable map.

5. The method of claim 1, further comprising:

providing the base map as a CAD file, an image file or a scanned file of a hardcopy architectural drawing.

6. The method of claim 1, further comprising:

classifying architectural features as connections in the base map by the trained neural network;

automatically placing the connections in the editable map; and assigning a floor span for each connection.

7. The method of claim 6, further comprising:

proposing placement of the connections in the editable map; and receiving user input confirming the placement of the connections.

8. The method of claim 1, further comprising:

presenting the editable map superimposed on the base map on the display interface.

9. The method of claim 1, further comprising:

identifying an enclosed area in the editable map;

classifying polygon objects, symbols and/or text within the enclosed area by the neural network; and assigning a room type for the enclosed space based on classification of the polygon objects, symbols and/or text within the enclosed area.

10. The method of claim 1, wherein the vectorized polygon representation of the classified architectural data comprises:

line strings representing walls; and polygon bounding boxes representing doors and windows.

11. The method of claim 1, wherein manually tracing the section of the base map comprises:

tracing only a portion of the second architectural feature.

12. The method of claim 1, wherein manually tracing the section of the base map comprises:

tracing an area around the first architectural feature and the second architectural feature.

13. The method of claim 1, wherein manually tracing the section of the base map comprises:

commencing tracing of the first architectural feature at a vertex.

14. A system for machine-assisted digital map editing, comprising:

a display interface;

an input device;

a processor; and a memory for storing processor-executable instructions including a trained machine learning model, wherein upon execution of the processor-executable instructions by the processor, the system is configured to:

classify architectural data in a digital base map by the trained machine learning model;

generate a vectorized polygon representation of the classified architectural data, the vectorized polygon representation including polygon objects representing architectural features in the base map;

present the base map on the display interface;

receive user input, via the input device, the user input manually tracing a section of the base map on the display interface, the section including a first architectural feature of a first type and a second architectural feature of a second type;

identify a first polygon object and a second polygon object representing the first architectural feature and the second architectural feature, respectively, in the vectorized polygon representation;

and propose or automatically place the first polygon object in a first color, and the second polygon object in a second color, at respective positions in an editable map corresponding to respective locations of the first architectural feature and the second architectural feature in the base map.

15. The system of claim 14, wherein upon execution of the processor-executable instructions by the processor, the system is further configured to:

receive user input via the input device to modify the first polygon object and/or the second polygon object; and update the editable map to show the first polygon object and/or the second polygon object, as modified, on the display interface.

16. The system of claim 14, wherein upon execution of the processor-executable instructions by the processor, the system is further configured to:

present the editable map superimposed on the base map on the display interface.

17. The system of claim 14, wherein upon execution of the processor-executable instructions by the processor, the system is further configured to:

identify an enclosed area in the editable map;

classify polygon objects, symbols and/or text within the enclosed area by the neural network; and assign a room type for the enclosed space based on classification of the polygon objects, symbols and/or text within the enclosed area.

18. The system of claim 14, wherein the trained machine learning model comprises:

a generative adversarial network (GAN) trained using a paired set of training images, comprising:

a set of base map images as inputs; and a set of vectorized polygon representations as outputs, wherein each base map image is associated to a vectorized polygon representation.

19. The system of claim 18, wherein the GAN comprises:

a generator neural network configured to:

generate a sample polygon representation upon input of a random noise vector; and a discriminator neural network configured to:

determine whether the sample is real or generated in comparison to real-world data; and feed back a result to the generator neural network.

20. The system of claim 19, wherein the generator neural network is trained to:

receive the base map as an input; and generate the vectorized polygon representation as an output.

* * * * *